(12) United States Patent
Umetsu et al.

(10) Patent No.: US 7,709,159 B2
(45) Date of Patent: May 4, 2010

(54) MASK, MASK FORMING METHOD, PATTERN FORMING METHOD, AND WIRING PATTERN FORMING METHOD

(75) Inventors: Kazushige Umetsu, Chino (JP); Shinichi Yotsuya, Chino (JP)

(73) Assignee: Seiko Epson Corporation (JP)

( * ) Notice: Subject to any disclaimer, the term of this patent is extended or adjusted under 35 U.S.C. 154(b) by 741 days.

(21) Appl. No.: 11/328,518

(22) Filed: Jan. 9, 2006

(65) Prior Publication Data

US 2006/0166111 A1    Jul. 27, 2006

(30) Foreign Application Priority Data

Jan. 21, 2005    (JP) .............. 2005-013696

(51) Int. Cl.
*G03F 1/00*    (2006.01)
(52) U.S. Cl. ................. 430/5; 430/22; 216/12
(58) Field of Classification Search ........ 430/5, 430/22, 311–313, 321–324; 216/12, 18; 378/34, 35; 219/121.68, 121.71
See application file for complete search history.

(56) References Cited

U.S. PATENT DOCUMENTS

| 4,309,495 | A | * | 1/1982 | Ernsberger ........... 430/5 |
| 5,372,916 | A | | 12/1994 | Ogawa et al. |
| 6,048,648 | A | | 4/2000 | Hashimoto et al. |
| 6,803,156 | B2 | * | 10/2004 | Akbar .................. 430/5 |
| 6,893,575 | B2 | * | 5/2005 | Yotsuya ............... 216/12 |
| 6,898,267 | B2 | | 5/2005 | Watanabe et al. |
| 6,955,993 | B2 | * | 10/2005 | Omori et al. .......... 430/5 |
| 2001/0033995 | A1 | * | 10/2001 | Tanaka et al. ........ 430/311 |
| 2002/0135287 | A1 | * | 9/2002 | Fukuzawa et al. .... 313/402 |
| 2003/0049545 | A1 | * | 3/2003 | Katakura .............. 430/5 |
| 2003/0059690 | A1 | * | 3/2003 | Yotsuya ............... 430/5 |
| 2003/0199144 | A1 | * | 10/2003 | Atobe et al. ......... 438/280 |
| 2003/0219095 | A1 | * | 11/2003 | Watanabe et al. .... 378/35 |
| 2004/0132294 | A1 | * | 7/2004 | Takagi et al. ........ 438/689 |

FOREIGN PATENT DOCUMENTS

| CN | 1193127 A | 9/1998 |
| JP | 05-003146 | 1/1993 |
| JP | 05-217863 | 8/1993 |
| JP | 06-267986 | 9/1994 |
| JP | 11-065124 | 3/1999 |
| JP | 2003-338447 | 11/2003 |
| JP | 2004-134446 | 4/2004 |

* cited by examiner

*Primary Examiner*—Mark F Huff
*Assistant Examiner*—Stewart A Fraser
(74) *Attorney, Agent, or Firm*—Harness, Dickey & Pierce, P.L.C.

(57) ABSTRACT

A mask, which is used to form predetermined patterns on a substrate, includes a pattern forming member that is provided with openings corresponding to the predetermined patterns; and a pattern holding member that overlaps one surface of the pattern forming member.

14 Claims, 11 Drawing Sheets

MASK, MASK FORMING METHOD, PATTERN FORMING METHOD, AND WIRING PATTERN FORMING METHOD

BACKGROUND

1. Technical Field

The present invention relates to a mask, to a mask forming method, pattern forming method, and to a wiring pattern forming method.

2. Related Art

As a method of forming minute wiring patterns of a semiconductor integrated circuit, for example, a photolithographic treatment has been widely used. In the wiring pattern forming method using the photolithographic treatment, large-scale facilities such as a vacuum device and an exposure device are necessary. In the devices, complicated processes are required to form wiring patterns having predetermined patterns. Furthermore, since efficiency in the use of materials reaches several percents, the materials cannot but be scrapped. As a result, there is a problem that a manufacturing cost is increased.

Meanwhile, there has been proposed a method of forming wiring patterns on the substrate by use of a liquid droplet discharging method of discharging liquid droplets of the liquid material from the liquid discharging head, that is, an ink-jet method. In the ink-jet method, liquid materials (functional liquid) for patterns are directly disposed on the substrate, and then the liquid materials are transformed into wiring patterns by heat treatment or the laser beam irradiation. Therefore, according to the above-mentioned method, since a photolithographic process becomes needless, it is possible to largely simplify a pattern forming process. In addition, since a functional liquid can be directly disposed on the desired region, it is possible to form minute patterns and there is a merit that it is possible to reduce the amount of the function liquid to be used.

When the wiring patterns are formed by means of the ink-jet method, lyophilic regions and lyophobic regions are patterned on the substrate in advance to form the wiring patterns so as to have an accurate line width and then functional liquid is selectively disposed on the lyophilic regions to be wiring pattern regions. As a method of selectively forming the lyophilic regions and the lyophobic regions, the following method has been proposed.

(1) A wiring pattern forming method using an image-formation optical method may be used as the method. In the image-formation optical method, patterning is performed on the substrate by means of surface irradiation of the laser beam. The surface irradiation of the laser beam modulates the amount of light at the mask by combining an image-formation system and the mask. For example, when the patterns are collectively irradiated by use of an excimer laser, grooves are sharply formed on the substrate. Moreover, lyophilicity is increased by the formation of the grooves and the alteration of the grooves caused by the laser irradiation (see JP-A-6-267986).

(2) A wiring pattern forming method using a photo mask may be used as the method. In the method, a mask is formed by patterning grooves corresponding to the wiring patterns on the resistor, and the mask is disposed on the substrate so as to come in contact with the substrate. Then, the laser beam is irradiated on the substrate through the mask to form grooves serving as wiring patterns (see JP-A-11-65124).

(3) A wiring pattern forming method using a metal mask may be used as the method. The metal mask is formed of a metal such as stainless steel, and has openings corresponding to the patterns. In the present method, the laser is irradiated on the metal mask, and then patterns are formed on the substrate by the laser beam transmitted through the openings of the metal mask (see JP-A-2004-134446).

However, the inventions disclosed in the above-mentioned methods have the following problems.

(1) When the wiring patterns are formed on the entire surface of the substrate, the image-formation optical method disclosed in JP-A-6-267986 cannot but increase a diameter of the image-formation system (lens). Therefore, the manufacturing cost is increased. In addition, in the scanning method, the pattern is divided into several sections and then the laser beam is irradiated on the several sections. When the scanning method is employed, high alignment accuracy is required to irradiate the laser beam on the divided patterns.

(2) In the wiring pattern forming method using a photo mask disclosed in JP-A-11-65124, the contact surface between the substrate and the resistor serves as a pattern forming surface. Accordingly, when the mask is repeatedly used, the mask is worn. Furthermore, when the misiles occurs during the irradiation of the laser beam, the misiles are attached to the mask. As a result, the mask is contaminated.

(3) In the wiring pattern forming method using a metal mask disclosed in JP-A-2004-134446, the metal mask is formed by means of a boring machining, which is performed by use of an etching method, a plating method, and a laser machining method. However, since the substrate is thick, it is difficult to minutely form the boring portion and to form patterns with high resolution. Furthermore, the metal mask has stiffness and flatness lower that those of a glass substrate. Accordingly, the metal mask does not come in close contact with the substrate, and does not have excellent resolution. Moreover, since the metal mask is deformed by extraction structure, it is not possible to form the extraction patterns.

(4) In addition, the common problem of the inventions disclosed in JP-A-6-267986, JP-A-11-65124 and JP-A-2004-134446 is that the strength of the contact mask is low due to the through holes corresponding to the wiring patterns on the contact mask.

SUMMARY

An advantage of some aspects of the invention is that it provides a mask capable of having increased strength, pattern forming regions with high resolution, and large area pattern forming regions formed by collectively patterned.

In order to solve the above-mentioned problems, according to the invention, a mask, which is used to form predetermined patterns on a substrate, includes a pattern forming member that is provided with openings corresponding to the predetermined patterns; and a pattern holding member that overlaps one surface of the pattern forming member.

According to the above-mentioned structure, since the pattern holding member is laminated on one surface of the pattern forming member, the strength of the mask is improved. That is, when a two-layer structure is formed by use of the mask according to the invention, the load applied to the pattern forming member is dispersed on the pattern holding member to be uniformed over the entire mask. Therefore, the strength of the mask is improved. For this reason, the durability of the mask is improved, and the mask can be recycled. As a result, it is possible to reduce the manufacturing cost of the mask.

Moreover, since the mask of the invention has the above-mentioned two-layer structure, it is possible to prevent the pattern forming member and the pattern holding member from being deformed, for example bent, due to the expansion and the contraction thereof. Accordingly, it is possible to form the mask with high accuracy. As a result, since a gap hardly occurs between the mask and the substrate on which the mask is disposed, it is possible to form predetermined patterns on the substrate in high resolution.

Furthermore, when a plurality of pattern forming members is attached to pattern holding member, the mask can be formed in a large size and large-area patterns can be collectively formed on the substrate.

In addition, the pattern forming member is held on the pattern holding member. Accordingly, for example, even when extraction patterns are formed, the pattern forming member is held by the pattern holding member (extraction patterns are not separated). For this reason, it is possible to form various kinds of patterns.

Furthermore, in the mask according to the invention, it is preferable that the pattern forming member can block or extinguish the laser beam, and that the pattern holding member can transmit the laser beam.

According to the above-mentioned structure, when the laser beam is irradiated to the mask having a laminated structure, the laser beam is transmitted through only openings of the pattern forming member. For this reason, since the pattern holding member does not block and transmits the laser beam, it is possible to form patterns corresponding to the openings of the pattern forming member on the substrate.

Moreover, in the mask according to the invention, it is preferable that the pattern holding member be at a position corresponding to the openings of the pattern forming member.

According to the above-mentioned structure, the pattern holding member is formed in the shape of a plate that does not have cavities of the openings. That is, since the pattern holding member transmits the laser beam, it is not necessary that opening patterns corresponding to the opening patterns of pattern forming member be formed in the pattern holding member. Accordingly, it is possible to improve the strength of the pattern holding member. As a result, it is possible to improve the strength of the entire mask.

In addition, in the mask according to the invention, it is preferable that each of the openings of the pattern forming member be bored through the pattern holding member so as to have a tapered shape in the direction from one surface of the pattern forming member toward the other surface thereof.

According to the above-mentioned structure, when the laser beam is irradiated to one surface of the pattern forming member, the laser beam going straight is reflected on a tapered portion (inclined surface), which is formed in the shape of a taper. Then, the reflected laser beam is collected on the other side of the pattern forming member. Accordingly, it is possible to improve the intensity of the laser beam, and to avoid the blur of the pattern forming regions.

Furthermore, in the mask according to the invention, it is preferable that the pattern forming member be formed of a material including silicon or glass.

According to the above-mentioned structure, when the laser beam is irradiated to the pattern forming member, the laser beam is extinguished so as to be transmitted or blocked. In addition, since the pattern forming member is formed of a material including silicon or glass to have a high strength, it is possible to prevent abrasion of the mask at the time of recycling thereof.

Moreover, in the mask according to the invention, it is preferable that the pattern holding member be formed of a material that includes any one of soda glass, low alkali glass, quartz glass, crystal, and silicon.

According to the above-mentioned structure, when the laser beam is irradiated to the pattern forming member, it is possible to transmit the laser beam.

In addition, in the mask according to the invention, it is preferable that the pattern holding member be formed of glass including alkali metal ions.

According to the above-mentioned structure, an electrostatic attraction is generated between the pattern forming member and the pattern holding member by heating the pattern forming member and the pattern holding member and by applying voltage thereto so that the boundary surfaces thereof are chemically bonded (bonded by use of an anodic bonding method). Accordingly, it is possible to laminate the pattern forming member and the pattern holding member so as to be fixed to each other.

Furthermore, according to the invention, a mask forming method includes forming a pattern forming member that includes forming an insulating film on a base material, patterning the insulating film in a predetermined pattern, forming openings in a predetermined pattern on the base material by using the patterned insulating film as a mask to remove the base material, and peeling off the insulating film from the base material; and bonding a pattern holding member on one surface of the pattern forming member.

According to the above-mentioned method, it is possible to easily manufacture a mask with high durability.

Moreover, in bonding of the mask forming method according to the invention, it is preferable that the pattern holding member be formed of glass including alkali metal ions, and that the pattern holding member overlap one surface of the pattern forming member and then anodic bonding is performed.

According to the above-mentioned method, it is possible to laminate the pattern forming member and the pattern holding member so as to be fixed to each other without an adhesive.

In addition, according to the invention, a pattern forming method, which forms patterns on a substrate in a predetermined pattern by using the mask, includes disposing the mask on the substrate; and forming pattern regions corresponding to the openings, which are formed on the pattern forming member in a predetermined pattern, by irradiating a laser beam on the substrate through the mask.

According to the above-mentioned method, it is possible to form predetermined pattern forming regions on the substrate by use of the mask according to the invention. That is, it is possible to form grooves on the substrate by the laser machining. Therefore, it is possible to form desired patterns by use of the pattern forming regions.

In the pattern forming method according to the invention, it is preferable that any one of an excimer laser, a gas laser and a solid laser be used as the laser beam in the forming pattern region.

According to the above-mentioned method, when the laser beam is irradiated on the substrate, ablation occurs. Therefore, it is possible to form predetermined pattern forming regions on the substrate.

In the pattern forming method according to the invention, it is preferable that the laser beam be irradiated on the substrate in several times in forming the pattern region.

According to the above-mentioned method, since the laser beam is irradiated on the substrate in several times, the energy density of the laser beam is increased. Therefore, it is possible to form predetermined pattern forming regions on the substrate. Furthermore, even when the substrate has a large area, it is possible to form predetermined pattern forming regions on the substrate.

In addition, the pattern forming method according to the invention may further include cleaning the mask with clearing solvent including sulphuric acid and aqueous hydrogen peroxide after the mask is separated from the substrate, after forming the pattern region. In this case, it is preferable that the substrate be formed of a material including an organic material.

According to the above-mentioned method, when a portion of the substrate formed of an organic material is peeled off by the irradiation of the laser beam, and is attached to the mask, it is possible to clean the mask with clearing solvent including sulphuric acid and aqueous hydrogen peroxide so as to remove attachments. Accordingly, since the attachments can be removed from the mask, it is possible to form pattern forming regions in high resolution by avoiding the block of the laser beam caused by the attachments.

Moreover, according to the invention, a wiring pattern forming method that forms wiring patterns by disposing functional liquid on the pattern forming regions, which are formed on the substrate by use of the pattern forming method, by use of a liquid droplet discharging method.

According to the above-mentioned method, since a photo lithography process becomes needless, it is possible to largely simplify a pattern forming process. In addition, according to the ink-jet method, since a functional liquid can be disposed on the desired region, it is possible to form minute patterns and there is a merit that it is possible to reduce the amount of the function liquid to be used.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1A:
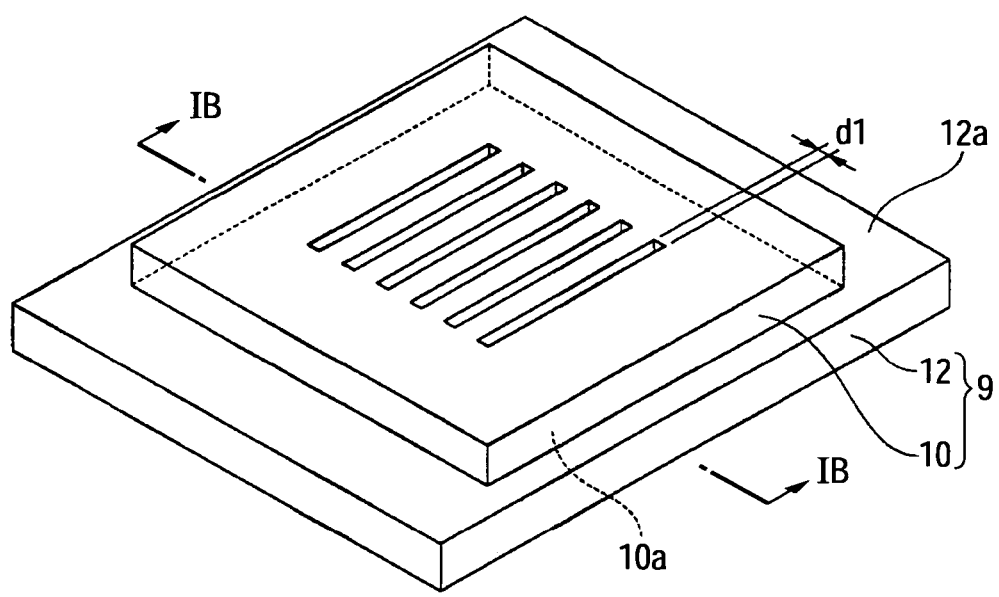
FIG. 1A is a perspective view schematically showing a contact mask according to a first embodiment.

Hereinafter, preferred embodiments of the invention will be described with reference to the accompanying drawings. Respective members are differently scaled in each drawing, in order to make the respective members apparent in the drawings.

Contact Mask

Figure 1B:
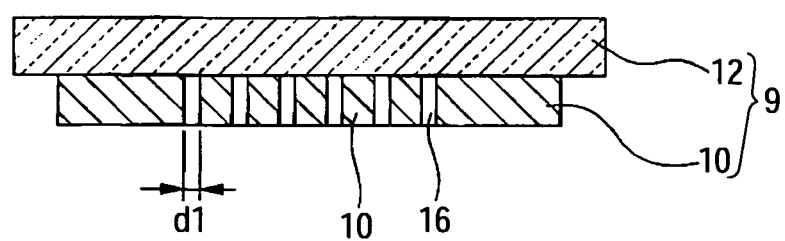
FIG. 1B is a cross-sectional view taken along line A-A shown in FIG. 1A.

The construction of the contact mask according to the present embodiment will be described with reference to FIGS. 1A and 1B. FIGS. 1A and 1B are views schematically showing a contact mask 9 according to the present embodiment.

As shown in FIGS. 1A and 1B, the contact mask (mask) 9 includes a pattern forming member 10 and a pattern holding member 12.

The pattern forming member 10 is provided with a plurality of through holes 16 (openings) corresponding to wiring patterns formed on a wiring substrate 14. The through holes 16 are bored through the pattern forming member 10 in a direction orthogonal to the surface direction of the pattern holding member 12. In addition, as shown in FIGS. 1A and 1B, the through holes 16 are formed such that a width d1 in a longitudinal direction of the through hole 16 is substantially equal to a wiring pattern to be formed. The pattern forming member 10 is formed of silicon (single-crystal silicon) having a plane orientation of (100). Therefore, as described below, when a laser beam 22 is irradiated on the pattern forming member 10, the laser beam 22 is blocked or extinguished in an area where the through hole 16 is not formed, and the laser beam 22 is transmitted through an area of the pattern forming member 10 where the through holes 16 is formed.

The pattern holding member 12 is formed in a plate shape. The pattern holding member 12 is not provided with cavities while the pattern forming member 10 is provided with cavities such as the through holes 16. That is, the pattern holding member 12 is composed of one plate, and a bonding surface 10a of the pattern holding member 12 bonded to the pattern holding member 10 is formed flat. Further, the pattern holding member 12 is formed in the same size as the pattern forming member 10 or in a larger size than the pattern forming member 10 so as to be formed in a rectangular shape, when viewed from the top of the pattern forming member 10, so that the pattern holding member 12 is coated on the entire surface of the pattern forming member 10 and holds the entire surface of the pattern forming member 10. In addition, the pattern holding member 12 is formed of any one of the materials such as soda glass, low-alkali glass, quartz glass, and crystal, or is formed of materials such as soda glass, low-alkali glass, quartz glass, and crystal as the main component. Accordingly, as described below, when the laser beam 22 is irradiated on the pattern holding member 12, the laser beam 22 is transmitted through the pattern holding member 12 formed of glass. Further, it is preferable that the pattern holding member 12 be formed of Pyrex glass (registered trademark) in which alkali metal ions such as natrium and lithium are added.

In the present embodiment, the bonding surface 10a of the pattern forming member 10 and the bonding surface 12a of the pattern holding member 12 come in contact with each other, and then the pattern forming member 10 and the pattern holding member 12 are bonded to each other by use of an anodic bonding method. That is, as shown in FIGS. 1A and 1B, in the contact mask 9, the pattern forming member 10, in which openings are formed corresponding to wiring patterns, and the pattern holding member 12 which holds the pattern forming member 10 are laminated and fixed to each other.

According to the present embodiment, since the pattern holding-member 12 is laminated on the pattern forming member 10, the strength of the contact mask 9 is improved. That is, by forming the contact mask 9 into a two-layer structure, load applied on the pattern forming member 10 is dispersed on the pattern holding member 12, so that the load is evenly applied all over the contact mask 9, whereby the strength of the contact mask 9 is improved. Accordingly, durability of the contact mask 9 is improved, whereby the contact mask 9 can be recycled and cost reduction can be achieved.

In addition, since the contact mask 9 of the invention has the two-layer structure, it is possible to prevent deformation such as bending due to expansion and contraction of the pattern forming member 10 and the pattern holding member 12. Thus, the contact mask 9 can be formed with high accuracy. Accordingly, there is no chance that a gap occurs between the contact mask 9 and the substrate, so that predetermined patterns can be formed on the substrate in high resolution.

By providing a plurality of the pattern forming members on the pattern holding member, the mask can be made large-area, whereby it is possible to collectively form large-area patterns on the substrate.

In addition, the pattern forming member 10 is held by the pattern holding member 12. Accordingly, for example, even when extraction patterns are formed, the pattern forming member is held by the pattern holding member (extraction patterns are not separated). For this reason, it is possible to form various kinds of patterns.

Contact Mask

Hereinafter, a contact mask forming method of the present embodiment will be described in detail with reference to FIGS. 2A to 2F.

Figure 2A:
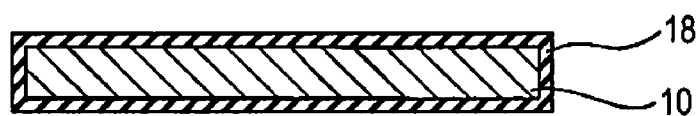
FIG. 2A to 2E are cross-sectional views showing processes for forming the contact mask.

First, as shown in FIG. 2A, a silicon wafer (single-crystal silicon substrate, base material) 10 having a plane orientation of (100) is provided. By thermal oxidation method, a silicon oxide film (SiO$_2$, insulating film) having a thickness of, for example, 1 μm is formed on the entire surface of the silicon wafer 10. Further, any film can be used as the film formed over the entire surface of the silicon wafer 10 as long as the film has a high durability with respect to a crystal anisotropic etching treatment to be performed on the silicon wafer 10 by using alkali solution to be described below. Therefore, silicon nitride film may be formed over the entire surface of the silicon wafer 10 by a CVD (chemical vapor deposition) method, and Au or Pt may be formed by a sputtering method as well.

Figure 2B:
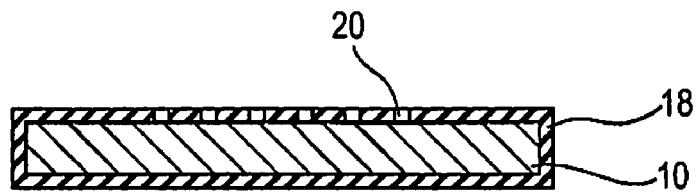

Next, as shown in FIG. 2B, on surface of the silicon oxide film 18 is coated with a resist. Then, photolithographic treatment is performed on the silicon oxide film 18 by using a photo mask corresponding to the wiring patterns, and the resist is patterned. Next, with the resist serving as a mask, etching treatment is performed on the silicon oxide film 18. Accordingly, the silicon wafer 10 is exposed by removing the silicon oxide film 18 in an area corresponding to the wiring patterns, so that openings 20 are formed.

Figure 2C:
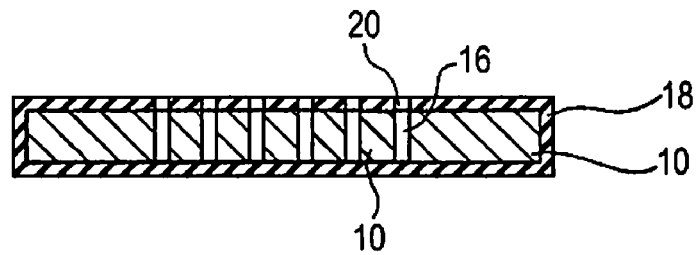

Next, as shown in FIG. 2C, by using the silicon oxide film 18, on which the etching treatment is performed corresponding to the wiring patterns, as a mask, crystal anisotropic wet etching treatment is performed. First, for a predetermined time period, the silicon wafer 10 is dipped in, for example, the aqueous solution of potassium hydroxide of 35% by weight, which is heated to 80° C. Accordingly, by using crystal orientation dependence, anisotropic wet etching treatment is performed on silicon in an area where the openings 20 are exposed, that is, in an area, which is not covered by the silicon oxide film 18. As a result, as shown in FIG. 2C, the through holes 16 corresponding to the wiring patterns are formed on the silicon wafer 10. The through holes 16 are formed in a direction orthogonal to the surface direction of the silicon wafer 10. Further, since the silicon oxide film 18 formed on the surface of the silicon wafer 10 etches slower than the silicon wafer 10, the silicon oxide film cannot be removed by the wet etching treatment.

Figure 2D:
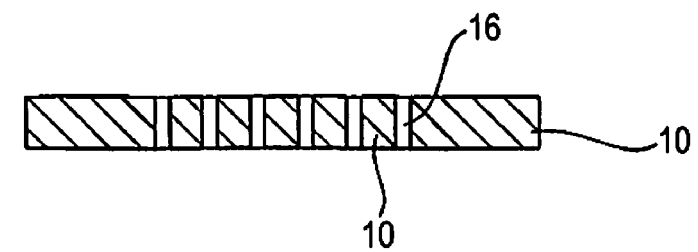

Next, as shown in FIG. 2D, the silicon wafer 10 is dipped in hydrofluoric acid based etching solution, and then the silicon oxide film 18 to be formed on the surface of the silicon wafer 10 is removed. Accordingly, the pattern forming member 10 having the openings 20 corresponding to the wiring patterns is formed.

Figure 2E:
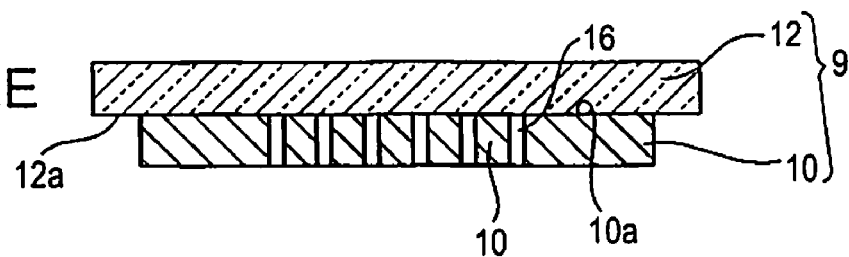

Next, as shown in FIG. 2E, first, the pattern holding member 12 formed of Pyrex glass (registered trademark) in which natrium is added is prepared. Then, the pattern holding member 12 is laminated on the pattern forming member 10, in which wiring patterns are formed, so as to be aligned with the pattern forming member 10. Next, both the pattern forming member 10 and the pattern holding member 12 are heated in the range of 300 to 400° C., and power voltage in the range of 500 V to 1 kV is applied between the pattern forming member 10 and the pattern holding member 12. Accordingly, a large electrostatic attraction is generated between the pattern forming member 10 and the pattern holding member 12, and the pattern forming member 10 and the pattern holding member 12 are chemically combined (bonded by use of an anodic bonding method) on the boundary surface therebetween. In this way, the contact mask 9 is composed of a laminated structure obtained by bonding the pattern forming member 10 and the pattern holding member 12 so as to fixed to each other.

Here, as a method of aligning, for example, a method using alignment marks can be used. First, on the bonding surface 10a of the pattern forming member 10, the through holes 16 serving as the alignment marks are formed in an area which does not overlap the openings corresponding to the wiring patterns, for example, in the periphery of the pattern forming member 10. The alignment marks are formed while the through holes 16 corresponding to the wiring patterns are formed. Next, an alignment mark formed of a resist is formed on the bonding surface 12a of the pattern holding member 12 by, for example, the photolithographic method. Next, alignment therebetween is performed by using a camera having a CCD mounted therein. The alignment is performed such that the alignment mark of the pattern forming member 10 overlaps the alignment mark of the pattern holding member 12. Next, after the alignment, the pattern forming member 10 is disposed on the pattern holding member 12.

Method of Forming Wiring Pattern Forming Regions

Next, a method of forming wiring pattern forming regions 24 on the wiring substrate 14 will be described with reference to FIG. 3A to 3D.

Figure 3A:
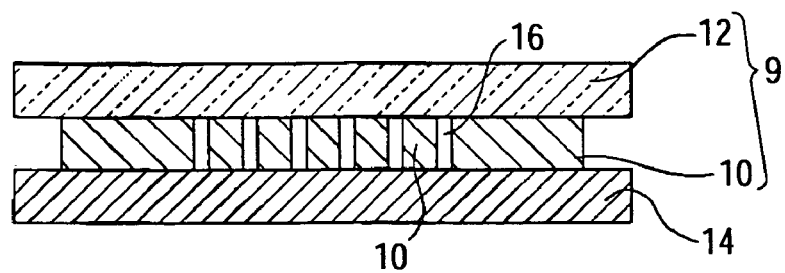
FIG. 3A to 3D are cross-sectional views showing processes for forming pattern forming regions.

First, as shown in FIG. 3A, the contact mask 9, formed by the above-described method, is aligned with the wiring substrate 14 in a predetermined position so as to be disposed on the wiring substrate 14. A method, in which an alignment marks are formed on both the contact mask 9 and the wiring substrate 14 and alignment between the contact mask 9 and the wiring substrate 14 is performed by using a camera having a CCD mounted therein, can be used as a method of alignment. A flexible printed circuit board, which is a flexible substrate formed of resin materials such as polyimide, epoxy, and crystalline polymer, can be used as the wiring substrate 14. Further, preferably, the wiring substrate 14 can be formed of transparent inorganic materials such as quartz, Pyrex (registered trademark), low alkali, non-alkali, soda, crystal liquid as well as various ceramic substrates.

Figure 3B:
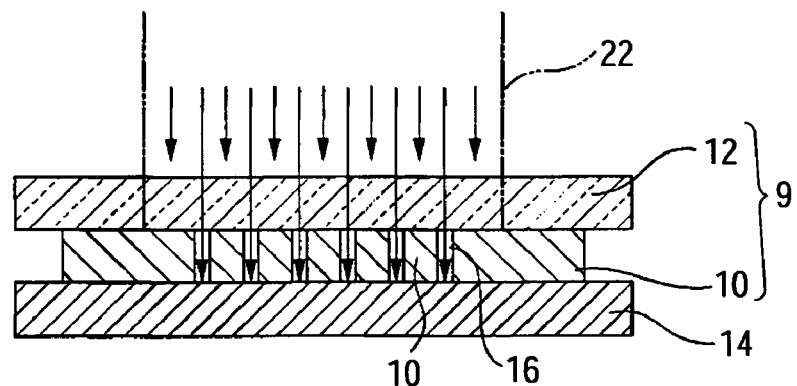

Next, as shown in FIG. 3B, the laser beam 22 is irradiated on an upper surface of the contact mask 9 on the wiring substrate 14. The irradiated laser beam 22 is transmitted through the pattern holding member 12 formed of glass of the contact mask 9, and reaches the pattern forming member 10. The laser beam 22, which has reached the pattern forming member 10, passes through the through holes 16 of the pattern forming member 10 formed of silicon, and then is irradiated on the wiring substrate 14. On the other hand, in an area where the through holes are not formed, the laser beam 22 is blocked and does not reach the wiring substrate 14, or the laser beam 22 is extinguished and reaches the wiring substrate 14.

Figure 3C:
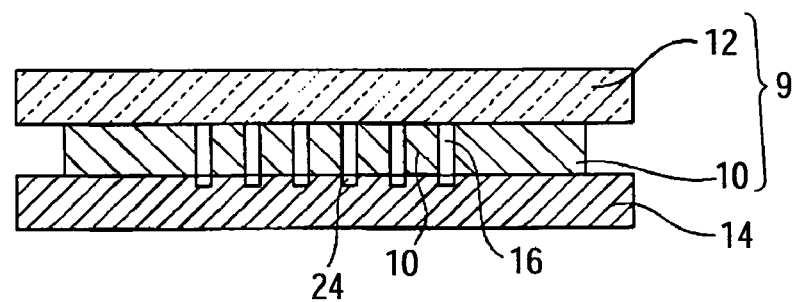

Then, as shown in FIG. 3C, the laser beam 22 irradiated on the wiring substrate 14 forms groove patterns by a laser ablation on a region of the wiring substrate 14 where the laser beam 22 is irradiated. That is, the region of the wiring substrate 14, on which the laser beam 22 is irradiated, is transformed by the energy of the laser beam 22 so as to form groove patterns. In the present embodiment, the groove patterns are the wiring pattern forming regions 24 corresponding to the wiring patterns. In addition, the laser beam, which has been transmitted through the area of the pattern forming member 10 of the contact mask 9 in which the through holes are not formed, is extinguished in the pattern forming member 10, and thus its energy becomes weak. Therefore, the laser beam rarely affects the wiring substrate 14.

It is preferable that the laser beam be irradiated under a lyophilic atmosphere such as an oxygen atmosphere of 20% or more in oxygen concentration. It is preferable that gas laser such as $CO_2$ laser, an infrared lamp, a xenon lamp, a YAG laser, an argon laser, carbon dioxide gas laser or excimer laser such as XeF, XeCl, XeBr, KrF, KrCl, ArF, ArCl be used as the laser beam 22.

Figure 3D:
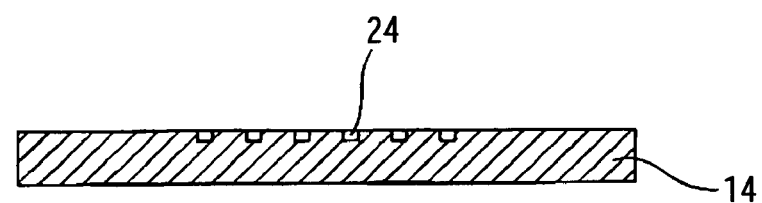

Next, as shown in FIG. 3D, after the irradiation of the laser beam 22 is terminated, the contact mask 9 is separated from the wiring substrate 14. In this way, by using the contact mask 9, groove patterns are formed on the wiring substrate 14 corresponding to the wiring patterns.

It is preferable that the contact mask 9 be cleaned after the contact mask 9 is separated from the wiring substrate 14. When the laser beam 22 is irradiated on the wiring substrate 14, since the wiring substrate 14 is formed of organic materials such as resin, a portion of the wiring substrate 14 is dispersed by the irradiation of the laser beam 22, so that the organic material is attached to the contact mask 9. For this reason, by cleaning the contact mask 9, the organic material attached to the contact mask is removed. More specifically, the contact mask 9, which is separated from the wiring substrate 14, is dipped in cleaning solution including sulfuric acid and hydrogen peroxide solution as the main component for a predetermined time period. Accordingly, the attachment to the contact mask 9 can be removed, and cost reduction can be achieved by recycling the contact mask 9.

Liquid Droplet Discharge Apparatus

Figure 4:
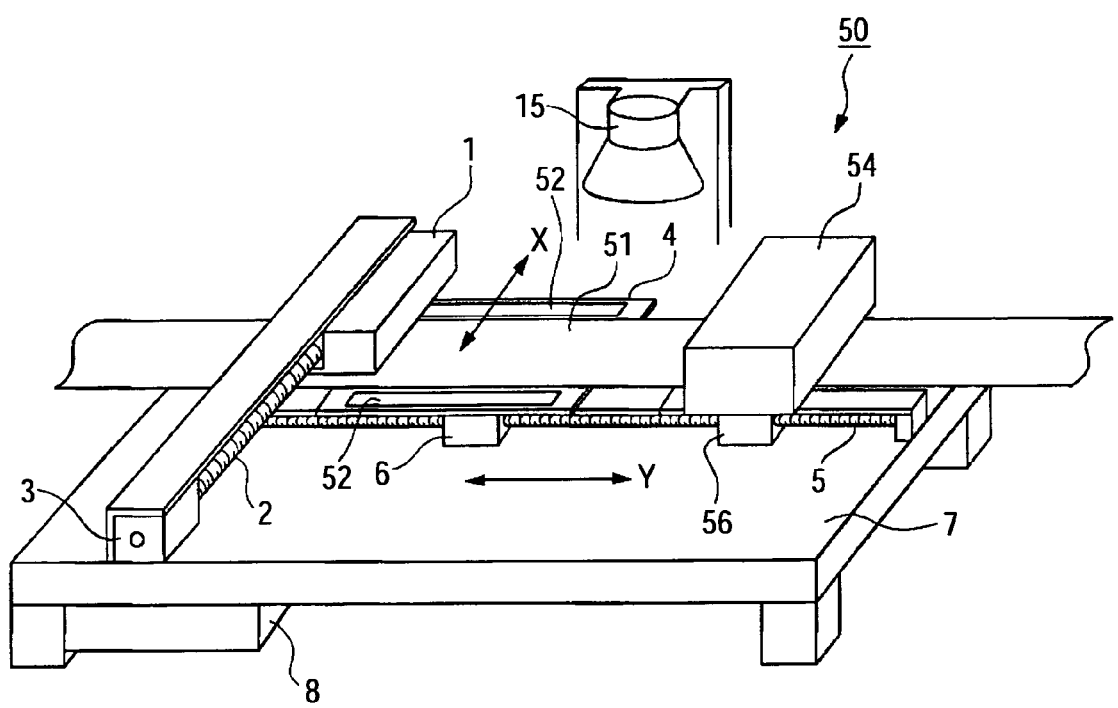
FIG. 4 is a perspective view schematically showing a liquid droplet discharging apparatus.

Hereinafter, a liquid droplet discharging apparatus 50 will be described in detail with reference to FIGS. 4 to 6. The liquid droplet discharging apparatus 50 discharges functional liquid in the wiring pattern forming regions 24 on the wiring substrate 14. As shown in FIG. 4, the liquid droplet discharging apparatus 50 includes an ink jet head group (discharging head) 1, an X-direction guide shaft (guide) 2 for driving the ink jet head group 1 in an X-direction, and an X-direction driving motor 3 for rotating the X-direction guide shaft 2. Further, the liquid droplet discharging apparatus 50 includes a placement table 4 for placing the wiring substrate 14 thereon, a Y-direction guide shaft 5 for driving the placement table 4 in a Y direction, and a Y-direction driving motor 6 for rotating the Y-direction guide shaft 5. Furthermore, the liquid droplet discharging apparatus 50 includes a base 7 on which the X-direction guide shaft 2 and the Y-direction guide shaft 5 are fixed to a predetermined position, respectively, and a controller 8 located under the base 7. The liquid droplet discharging apparatus 50 further includes a cleaning mechanism 54 and a heater 15.

Here, the X-direction guide shaft 2, the X-direction driving motor 3, the Y-direction guide shaft 5, the Y-direction driving motor 6, and the placement table 4 forms a head moving mechanism which relatively moves the ink jet head group 1 with respect to the wiring substrate 14 arranged on the placement table 4. In addition, the X-direction guide shaft 2 is a guide for moving the ink jet head group 1 in a direction (X direction) substantially orthogonal to the length direction (Y direction) of the wiring substrate 14.

The ink jet head group 1 includes a plurality of ink jet heads which discharge the dispersion solution (liquid material) containing conductive fine particles from a nozzle (outlet) and supply the dispersion solution to the wiring substrate 14 in a predetermined interval. Each of the ink jet heads is designed to individually discharge the dispersion solution on the basis of a discharge voltage output from the controller 8. The ink jet head group 1 is fixed to the X-direction guide shaft 2, and the X-direction driving motor 3 is connected to the X-direction guide shaft 2. Motors such as stepping motors are used as the X-direction driving motor 3. When a driving pulse signal indicating the X direction is supplied from the controller 8, the X-direction guide shaft 2 is rotated. Then, when the X-direction guide shaft 2 is rotated, the ink jet head group 1 moves with respect to the base 7 in the X direction.

Figure 5A:
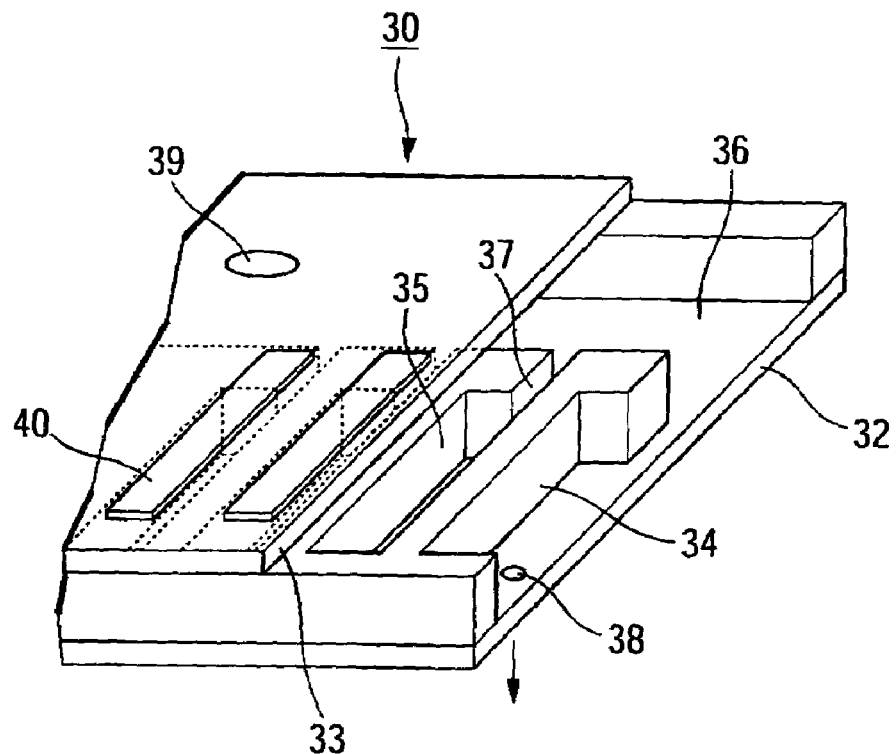
FIG. 5 is a view showing an inkjet head of the liquid droplet discharging apparatus.
Figure 5B:
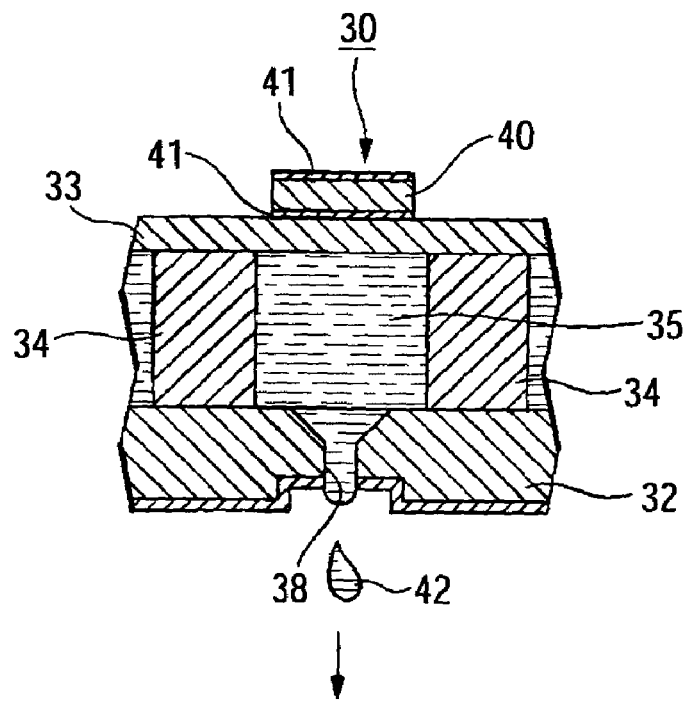

Hereinafter, the plurality of ink jet heads forming the ink jet head group 1 will be described in detail. FIG. 5 is a view showing the ink jet head 30. FIG. 5A is a perspective view showing main components of the ink jet head, and FIG. 5B is a cross-sectional view showing the main components of the ink jet head. FIG. 4 is a bottom view of the ink jet head 30.

As shown in FIG. 5A, the ink jet head 30 includes, for example, a nozzle plate 32 formed of stainless steel, a vibration plate 33, and a partitioning member (reservoir plate) 34. The nozzle plate 32 and the vibration plate 33 are connected to each other through the partitioning member 34. The partitioning member 34 forms a plurality of spaces 35 and a region 36 in which liquid is stagnated, between the nozzle plate 32 and the vibration plate 33. Liquid material is filled in each space 35 and the region 36, and each space 35 communicates with the region 36 through a supply port 37. The nozzle plate 32 is formed with a plurality of nozzle holes 38 which are longitudinally and transversely arranged for jetting the liquid from the space 35. In the meantime, the vibration plate 33 is formed with a hole 39 for supplying liquid material to the region 36 in which liquid is stagnated.

In addition, as shown in FIG. 5B, a piezoelectric element 40 is bonded to a surface opposite to a surface of the vibration plate 33 facing the space 35. The piezoelectric element 40 is interposed between a pair of electrodes 41, and is designed to bend so as to protrude outward when electricity is supplied to the piezoelectric element 40. Further, the vibration plate 33, to which the piezoelectric element 40 is bonded in the above-described construction, is integrally formed with the piezoelectric element 40 and thus bent outward, whereby the capacity of the space 35 increases. Therefore, liquid material whose quantity is equivalent to the increased capacity of the space 35 is introduced into the region 36 through the supply port 37. When electricity is not supplied to the piezoelectric element 40, both the piezoelectric element 40 and the vibration plate 33 return to their original shape. Therefore, in respect that the capacity of the space 35 also returns to its original capacity, the pressure of the liquid material inside the space 35 increases, so that a droplet 42 of the liquid is discharged from the nozzle hole 38 toward the substrate.

Referring to FIG. 4, the placement table 4 is provided for mounting thereon the wiring substrate 14 which is coated with a dispersion solution by the liquid droplet discharging apparatus 50. The placement table 4 includes a mechanism (alignment mechanism) for fixing the wiring substrate 14 to a reference position. The placement table 4 is fixed by the Y-direction guide shaft 5, and the Y-direction driving motors 6 and 56 are connected to the Y-direction guide shaft 5. Motors such as stepping motors are used as the Y-direction driving motors 6 and 56. The Y-direction driving motors 6 and 56 rotate the Y-direction guide shaft 5 when the controller 8 supplies a driving pulse signal indicating the Y direction. Then, when the Y-direction guide shaft 5 rotates, the placement table 4 moves in the Y direction with respect to the base 7.

The liquid droplet discharging apparatus 50 includes the cleaning mechanism 54 which cleans the ink jet head group 1. The cleaning mechanism 54 moves along the Y-direction guide shaft 5 by the Y-direction driving motor 56. The moving of the cleaning mechanism 54 is also controlled by the controller 8. Hereinafter, flushing areas 52a and 52 of the liquid droplet discharging apparatus 50 will be described.

A heater 15 is a means for performing heat treatment (drying treatment or baking treatment) on the wiring substrate 14 by lamp anneal. That is, the heater 15 can evaporate and dry the liquid material discharged onto the wiring substrate 14, and perform heat treatment on the wiring substrate 14 so as to convert the liquid material into a conductive layer. The controller also controls whether to supply power to the heater 15 or not.

In the liquid droplet discharging apparatus 50 according to the present embodiment, in order to discharge the dispersion solution to a predetermined wiring pattern forming region, the controller 8 supplies a predetermined driving pulse signal to the X-direction driving motor 3 and/or the Y-direction driving motor 6, and the ink jet head group 1 and the wiring substrate 14 (placement table 4) are relatively moved by moving the ink jet head group 1 and/or the placement table 4. Then, while they are relatively moving, the controller 8 supplies discharge voltage to a predetermined ink jet head 30 of the ink jet head group 1, and thus the dispersion solution is discharged from the ink jet head 30.

In the liquid droplet discharging apparatus 50, the quantity of the liquid droplet from each ink jet head 30 of the ink jet head group 1 can be adjusted by the volume of the discharge voltage which is supplied by the controller 8. In addition, the pitch of the liquid droplet to be discharged onto the wiring substrate 14 is defined by a relative moving speed of the ink jet head group 1 and the wiring substrate 14 (placement table 4), and a discharge frequency (frequency at the time when the discharge voltage is supplied) from the ink jet head group 1.

According to the liquid droplet discharging apparatus 50 of the present embodiment, patterns can be formed by moving the ink jet head group 1 along the X-direction guide shaft 2 or the Y-direction guide shaft 5 and introducing the liquid droplet in an arbitrary position of a desired region of the wiring substrate 14. After a pattern is formed in one desired region, patterns can be easily formed in another desired region by placing the wiring substrate 14 crisscross in the length direction (Y direction).

The piezoelectric method is used in the present embodiment; however, examples of the discharge techniques used for the liquid droplet discharge method may include an electrification control method, a pressurized vibration method, an electrothermal conversion method, an electrostatic attraction method and so on. For example, in the electrothermal conversion method, the material is rapidly vaporized to generate bubbles by a heater provided in a space in which the material is stored, and thus the material in the space is discharged by means of the pressure of bubbles.

Wiring Pattern Forming Method

Hereinafter, a method of discharging the functional liquid to the wiring pattern forming region 24 on the wiring substrate 14 and forming wiring patterns thereon will be described with reference to FIGS. 3, 4A and 4B.

Functional Liquid Disposing Process

By using the aforementioned liquid droplet discharging apparatus 50, the functional liquid is discharged to the wiring pattern forming regions 24 composed of groove patterns on the wiring substrate 14. Accordingly, a functional film is formed in the wiring pattern forming regions 24 by the surface tension of the functional liquid, the depth of the groove pattern, lyophilicity of the surface of groove walls. When liquid repelling treatment is performed in an area except for an area where the groove patterns are formed, the functional liquid is not smeared on the area where the lyophobic treatment is performed, and the groove patterns are adequately wetted and dispersed. The conditions of the liquid droplet discharge may be selected as follows. The weight of the ink is 4 ng/dot. The ink flow rate (the discharging speed) is in the range of 5 to 7 m/sec. With respect to the atmosphere for discharging the liquid droplets, the temperature and the humidity may be set to 60° C. or less and 80% or less, respectively. As a result, it is possible to perform a stable liquid droplet discharge without clogging of the discharge nozzle of the liquid droplet discharge head 1.

As the functional liquid for forming wiring patterns in the present embodiment, it is possible to utilize the dispersion solution in which conductive fine particles are dispersed. The conductive fine particles may be a conductive polymer or a superconductive fine particle as well as metal containing any one of gold, silver, copper, palladium, and nickel and these metal oxides. These conductive fine particles of which the surfaces are coated with organic materials may be used in order to enhance dispersibility. The diameter of the conductive fine particle may be in the range of 1 nm to 0.1 μm. If the diameter is larger than 0.1 μm, the nozzle of the liquid droplet discharge head may be clogged. If the diameter is smaller than 1 nm, the volume ratio of the coating to the conductive fine particle increases, so that the ratio of the organic materials to the obtained film is too excessive.

The dispersion medium capable of dispersing the aforementioned conductive fine particles may be, but is not limited to, a material that does not generate blocking. For example, the dispersion medium includes, for example, water, an alcohol, such as methanol, ethanol, propanol, butanol, etc., a hydrocarbon compound such as n-heptane, n-octane, decane, dodecane, tetradecane, toluene, xylene, cymene, durene, indene, dipentene, tetrahydro naphthalene, decahydro naphthalene, cyclo hexylene benzene, etc., an ether compound, such as ethylene glycol dimethly ether, ethylene glycol diethly ether, ethylene glycol methly ethyl ether, diethylene glycol dimethly ether, diethylene glycol methly ethyl ether, diethylene glycol methly ethyl ether, 1,2-dimethoxy ethane, bis(2-methoxy ethyl)ether, p-dioxane, etc., and a polar compound, such as propylene carbonate, γ-butyrolactone, N-methyl-2-pyrolidone, dimethyl formamide, dimethyl sulphaoxide, cyclo hexanone, etc. Among them, in terms of dispersibiltiy of the micro-particles, stability of the dispersion solution, easy applicability to the liquid droplet discharge method, the water, the alcohol compound, the hydrocarbonate compound, and the ether compound are preferable. Preferred dispersion media are the water and the hydrocarbonate compound.

The surface tension of the dispersion solution of the conductive fine particles may be in the range of 0.02 N/m to 0.07 N/m. When liquid is discharged with the ink-jet method, if the surface tension is less than 0.02 N/m, since the wettability of the ink composition to the nozzle surface increases, the dispersion deviation can be generated. If the surface tension is more than 0.07 N/m, since the meniscus shape at the front end of the nozzle is not stabilized, it is difficult to control discharge amount and discharge timing. In order to adjust the surface tension, an infinitesimal amount of surface tension control agents, such as fluorine, silicon, and nonion control agents, is added to the dispersion solution to an extent that the control agents cannot deteriorate the contact angle with respect to the substrate. The nonion surface tension control agents enhance wettability of the liquid with respect to the substrate, improve the leveling of the film, and prevent fine unevenness of the film from being generated. The surface tension control agents may include an organic compound, such as alcohol, ether, ester, ketone, etc., if necessary.

The viscosity of the dispersion solution may be in the range of 1 to 50 mPa·s. In case of the liquid droplets as the liquid material being discharged by the liquid droplet discharge method, if the viscosity is smaller than 1 mPa·S, the peripheral portion of the nozzle can be easily contaminated due to the effusion of the ink. If the viscosity is larger than 50 mPa·S, the frequency of the clogging of the nozzle opening increases so that it is difficult to smoothly discharge the liquid droplets.

Intermediate Drying Process

In order to remove the dispersion media of the functional film disposed in the wiring pattern forming region 24 on the wiring substrate 14, the drying process is performed, if necessary. The temperature in the drying process is set to the temperature at which the conductive fine particles of the functional liquid do not combine with each other, that is, below the sintering temperature. The drying process may employ, for example, a lamp annealing process as well as a general process using hot plates, electric furnaces, or the like, to heat the substrate 14. A light source used for the lamp annealing process includes, but is not limited to, an infrared lamp, a xenon lamp, a YAG laser, an argon laser, a carbon dioxide laser, an excimer laser using XeF, XeCl, XeBr, KrF, KrCl, ArF, ArCl, etc. Preferably, the power of these lasers is generally in the range of 10 to 5000 W. With the drying process, the dispersion media is removed from the functional liquid, and a layer of the functional liquid containing silver as the conductive fine particles is formed on the wiring substrate 14.

Sintering Process/Optical Process

Next, in order to improve the electrical contact between the fine particles and to completely remove the dispersion media, the thermal treatment and the optical treatment are performed on the functional liquid. To be more specific, for example, these treatments are performed in the range of 350° C. to 450° C., and the thermal treatment is performed with the functional liquid for a predetermined timing in an atmosphere including oxygen, nitrogen, and $H_2O$ under the atmospheric pressure. The process temperature of the thermal treatment or the optical treatment is properly determined considering a boiling point (vapor pressure) of the dispersion media, a kind or pressure of the atmospheric gas, thermal behaviors such as dispersion properties of the fine particles and oxidation properties of the fine particles, existence or quantity of the coated material, an allowable temperature limit of the base material, and so on. When the surface of the conductive fine articles is coated with coating materials such as organic materials, the coating materials are removed as well, in order to enhance dispersibility of the surface of the conductive fine particles.

With the above-described processes, wiring patterns formed of, for example, silver are formed in the pattern forming regions 24 on the wiring substrate 14.

According to the present embodiment, since a photolithographic process is unnecessary, the wiring pattern forming process can be simplified. In addition, according to the liquid droplet discharge method, the functional liquid can be accurately disposed in the desired area, so that fine patterns can be formed and reduction of the functional liquid for use is possible.

Second Embodiment

Hereinafter, a second embodiment will be described with reference to FIGS. 6A and 6B.

In the first embodiment, through holes 16, which correspond to wiring patterns to be formed in a contact mask 9, are formed in a pattern forming member so as to have wall surfaces perpendicular to the plane direction of the contact mask 9. Meanwhile, the present embodiment is different from the first embodiment in that each of the though holes 16 is formed in a pattern forming member so as to have a wall surface inclined with respect to the plane direction of the contact mask 9, that is, so as to have a tapered wall surface. In addition, other basic configurations of the contact mask 9 are the same as those in the first embodiment. Then, the common components are indicated by same reference numerals and the detailed description thereof will be omitted.

Contact Mask

Figure 6A:
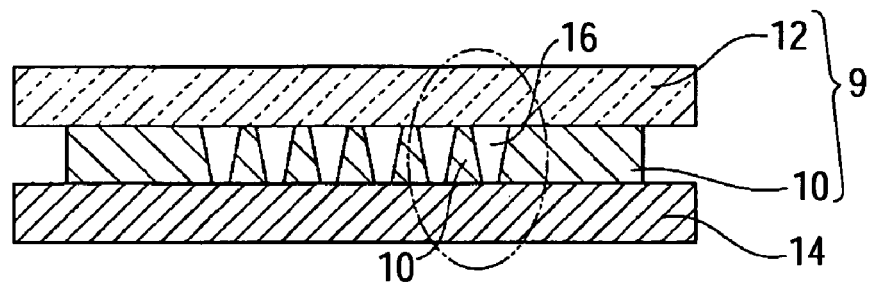
FIG. 6 is a cross-sectional view schematically showing a contact mask according to a second embodiment.
Figure 6B:
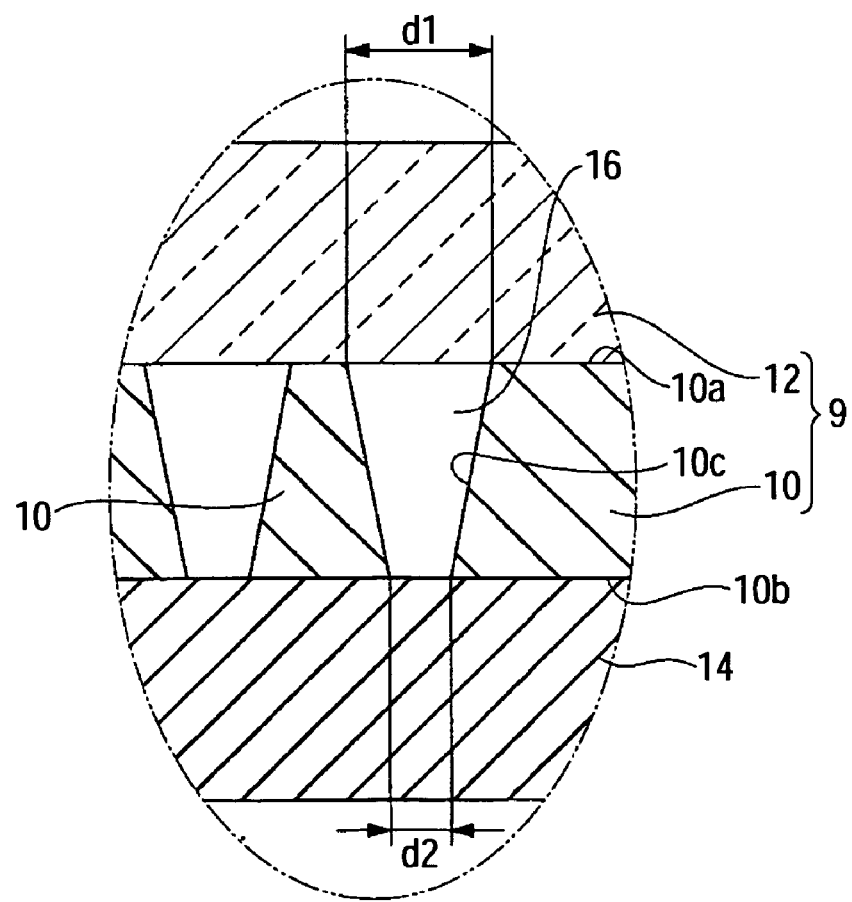

FIG. 6A is a cross-sectional view schematically showing the contact mask 9 of the present embodiment. FIG. 6B is an enlarged cross-sectional view showing a portion of the contact mask 9, which is indicated by a two-dot chain line. As shown in FIGS. 6A and 6B, the contact mask 9 includes a pattern forming member 10 and a pattern holding member 12. The pattern forming member 10 is provided with a plurality of through holes 16, which correspond to wiring patterns to be formed on a wiring substrate 14. The wall surface 10c of each of the through holes 16 is inclined at a predetermined angle with respect to a bonding surface 10a of the pattern forming member 10 so as to be tapered off in the direction from the bonding surface 10a toward an opposite surface 10b. That is, open width d1 of the through hole on the bonding surface 10a of the pattern forming member 10 is larger than open width d2 thereof on the opposite surface 10b. Thus, each of the through holes 16 is bored through the pattern forming member 10 so as to have a tapered shape in the direction from the bonding surface 10a toward the opposite surface 10b thereof. The open width d2 of each of the through holes 16 on the opposite surface 10b is equal to width of the wiring patterns formed on the wiring substrate 14. That is, the pattern forming member 10 is disposed on the wiring substrate 14 so that the opposite surface 10b thereof comes in contact with the wiring substrate 14, and then pattern forming regions are formed on the wiring substrate 14 on the basis of the open width d2 of each of the through holes 16 on the opposite surface 10b.

In the present embodiment, similar to the first embodiment, the bonding surface 10a of the pattern forming member 10 and the bonding surface 12a of the pattern holding member 12 come in contact with each other, and then the pattern forming member 10 and the pattern holding member 12 are bonded and fixed to each other by use of an anodic bonding method. In this manner, the contact mask 9 has a laminated structure including the pattern forming member 10 and the pattern holding member 12. The pattern forming member 10 has openings corresponding to the wiring patterns, and the pattern holding member 12 holds the pattern forming member 10.

Method of Forming the Contact Mask

Next, only differences from the first embodiment will be described in an embodiment of a method of forming the contact mask 9 according to the present embodiment.

A silicon oxide etched in accordance with the wiring patterns is used as a mask to conduct a crystal anisotropy wet etching. For example, a silicon wafer is dipped in the aqueous solution of potassium hydroxide of 35% by weight, which is heated at 80° C., during a predetermined time period. Accordingly, exposed silicon at openings, that is, portions not coated with the silicon oxide are anisotropy wet etched by use of crystal orientation dependence. In this case, since liquid pressure decreases in the direction from the bonding surface 10a of the pattern forming member 10 toward an opposite surface 10b thereof, size of the opening of each of the through holes 16 is gradually reduced as seen from the bonding surface 10a. As a result, as shown in FIGS. 6A and 6B, the tapered through holes 16 corresponding to the wiring patterns are formed in the pattern forming member 10.

According to the present embodiment, for example, when a laser beam 22 is irradiated from the opposite side to the wiring substrate 14, the laser beam 22 going straight is reflected on the wall surface 10c of each of the through holes 16. Then, the reflected laser beam 22 is collected. Accordingly, it is possible to irradiate a more intensive laser beam 22 on the wiring substrate 14, and to prevent the defocus of the pattern forming regions to be formed.

Third Embodiment next, a third embodiment will be described with reference to FIG. 7.

In the first embodiment, groove patterns corresponding to the wiring patterns are formed on the wiring substrate 14. Meanwhile, the present embodiment is different from the first embodiment in that a lyophobic treatment is performed in advance to form a lyophobic film on the wiring substrate 14. In addition, since other pattern forming method and wiring pattern forming method are the same as those in the first embodiment, the common components and manufacturing processes are indicated by same reference numerals and the detailed description thereof will be omitted.

First, before the contact mask 9 is disposed on the wiring substrate 14, the wiring substrate 14 is cleaned by means of UV (ultraviolet ray) irradiation, solvent such as water, ultrasonic wave, plasma irradiation, etc.

Figure 7A:
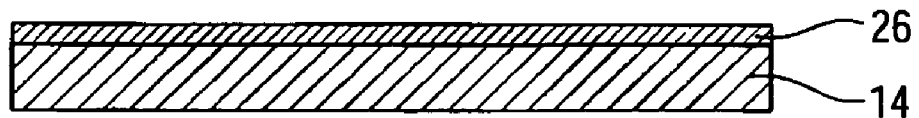
FIG. 7 is a cross-sectional view showing processes for forming pattern forming regions according to a third embodiment.

Next, as shown in FIG. 7A, after cleaning of the wiring substrate 14, a lyophobic treatment is performed to form a lyophobic film 26 on the desired regions of the wiring substrate 14. A method of forming a self-organizing film such as an organic molecular film on the substrate is used as one example of methods of performing the lyophobic treatment. The self-organizing film is the film that is composed of binding functional groups and linear chain molecules. Furthermore, the self-organizing film is formed by orienting compounds, which have very high orientation by the interaction between the linear chain molecules. The binding functional groups can react to constituent atoms of a base layer such as a substrate. Since the self-organizing film is formed by orienting single molecules, the self-organizing film can be formed so as to be very thin and so as to have a uniform molecule level. That is, since the same molecules are located on the surface of the film, it is possible to allow the surface of the film to be uniform and to allow the film to have excellent lyophobicity. A method of irradiating plasma at normal pressures is used as another method of performing the lyophobic treatment. Gases used for plasma treatment can be variously selected in consideration of surface materials of the substrate. For example, fluorocarbon based gases, such as the methane tetrafluoride, perfluorohexane, perfluorodecane, etc., can be used as treatment gases. In this case, it is possible to form a lyophobic fluorinated polymer film on the surface of the substrate.

Figure 7B:
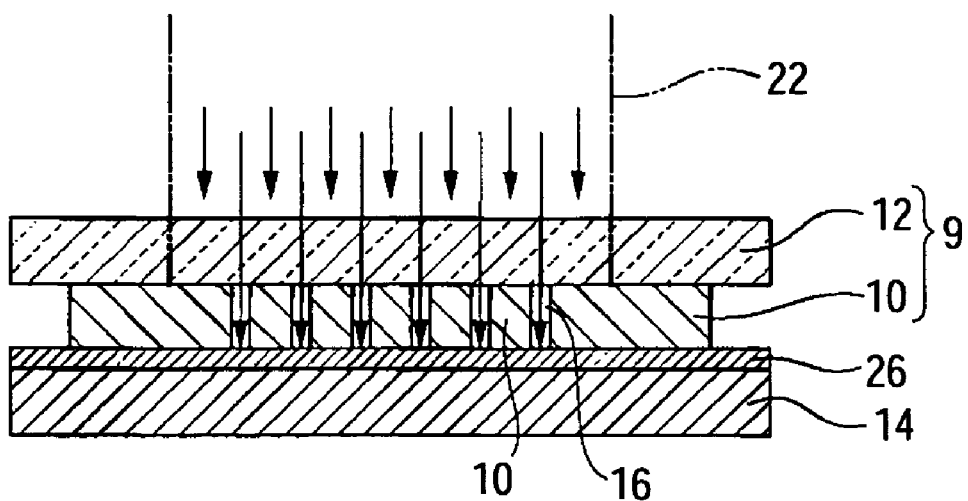
Figure 7C:
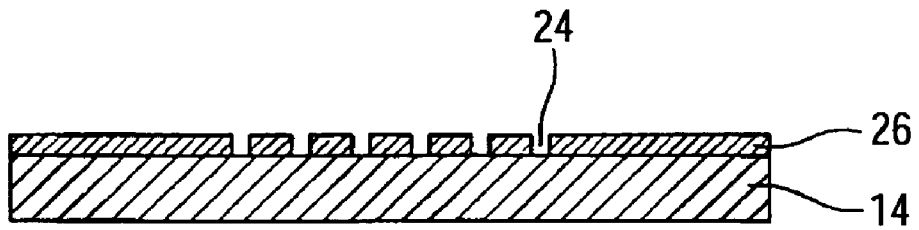

Next, as shown in FIG. 7B, the contact mask 9 is disposed on the substrate 14, and then the laser beam 22 is irradiated from the upper side of the contact mask 9 to partially destroy/remove the lyophobic film 26. Accordingly, as shown in FIG. 7C, the pattern forming regions 24, which have grooves corresponding to the wiring patterns, are formed by exposing the irradiated regions on the wiring substrate 14. The pattern forming regions 24 are more lyophilic than the other regions. In addition, the irradiation of the laser beam 22 is preferably performed in the atmosphere apt to be lyophilic, for example in the dense oxygen atmosphere with oxygen density of 20% or more.

Next, functional liquid is discharged along the pattern forming regions 24 on the wiring substrate 14 by the liquid droplet discharging apparatus 50. Accordingly, wiring patterns are formed on the wiring substrate 14.

According to the present embodiment, since a lyophobic film is formed on non-pattern forming regions, the functional liquid is not smeared on the non-pattern forming regions. Meanwhile, since the pattern forming regions 24 is more lyophilic than the other regions, the discharged functional liquid wets the pattern forming regions 24 and broadens thereon. Therefore, it is possible to form the wiring patterns on the wiring substrate 14.

Fourth Embodiment

Next, a fourth embodiment will be described with reference to FIG. 8.

In the first embodiment, groove patterns corresponding to the wiring patterns are formed on the wiring substrate 14. Meanwhile, the present embodiment is different from the first embodiment in that a lyophobic treatment is performed in advance to form a lyophobic film on the wiring substrate 14 and thus grooves are formed on the wiring substrate 14 and the lyophobic film. That is, the present embodiment is an example combining the first embodiment and the third embodiment. In addition, since other pattern forming method and wiring pattern forming method are the same as those in the first and the second embodiment, the common components and manufacturing processes are indicated by same reference numerals and the detailed description thereof will be omitted.

First, before the contact mask 9 is disposed on the wiring substrate 14, the wiring substrate 14 is cleaned by means of UV (ultraviolet ray) irradiation, solvent such as water, ultrasonic wave, plasma irradiation, etc.

Figure 8A:
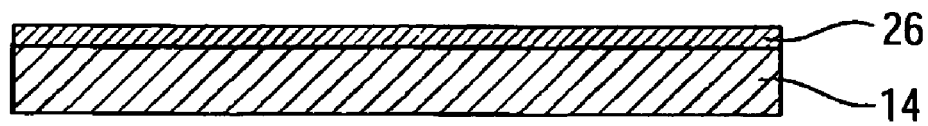
FIG. 8 is a cross-sectional view showing processes for forming pattern forming regions according to a fourth embodiment.

Next, as shown in FIG. 8A, after cleaning of the wiring substrate 14, a lyophobic treatment is performed to form a lyophobic film 26 on the desired regions of the wiring substrate 14.

Figure 8B:
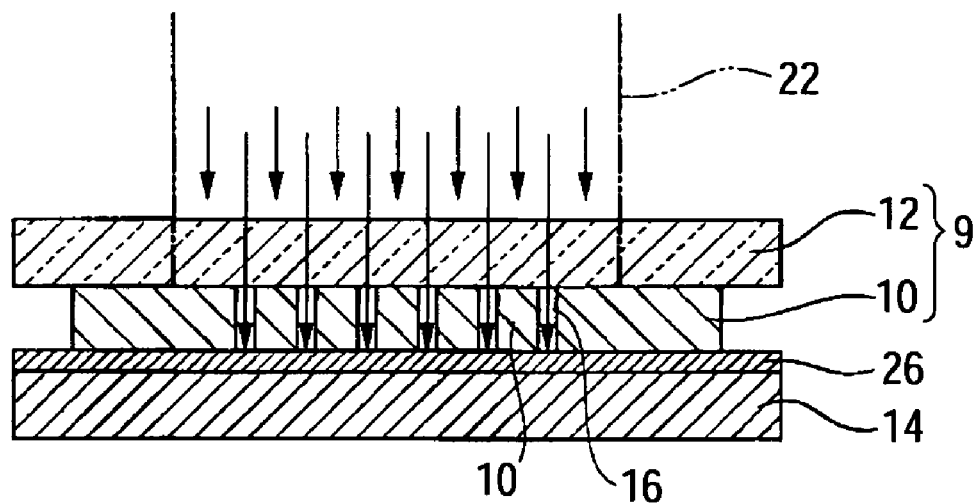
Figure 8C:
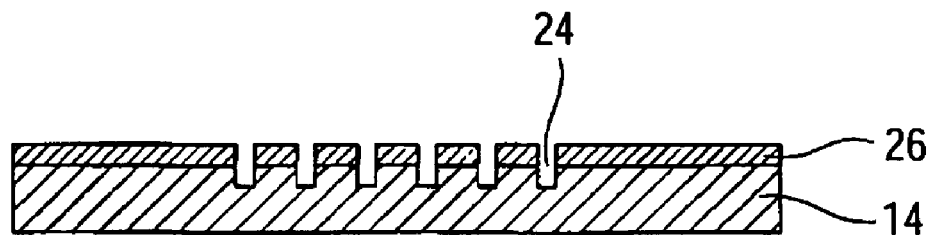

Next, as shown in FIG. 8B, the contact mask 9 is disposed on the substrate 14, and then the laser beam 22 is irradiated from the upper side of the contact mask 9. For this reason, as shown in FIG. 8C, the irradiated lyophobic film 26 disposed on the substrate 14, and the substrate 14 are partially destroyed/removed. Accordingly, the pattern forming regions 24, which have grooves corresponding to the wiring patterns, are formed.

Next, functional liquid is discharged along the pattern forming regions 24 on the wiring substrate 14 by the liquid droplet discharging apparatus 50. Accordingly, wiring patterns are formed on the wiring substrate 14.

According to the present embodiment, it is possible to obtain the same effects as those in the third embodiment and the pattern forming regions 24 are formed by the grooves, which are formed on the lyophobic film 26 and the wiring substrate 14. Accordingly, it is possible to form the wiring patterns well.

Fifth Embodiment

Next, a fifth embodiment will be described with reference to FIGS. 9A and 9B.

The laser beam irradiation method in which the entire surface is collectively irradiated by the laser beam is used in the first embodiment. Meanwhile, the present embodiment is different from the first embodiment in that a scan type laser beam irradiation method is used. In addition, since other pattern forming method and wiring pattern forming method are the same as those in the first embodiment, the common components and manufacturing processes are indicated by same reference numerals and the detailed description thereof will be omitted.

Figure 9A:
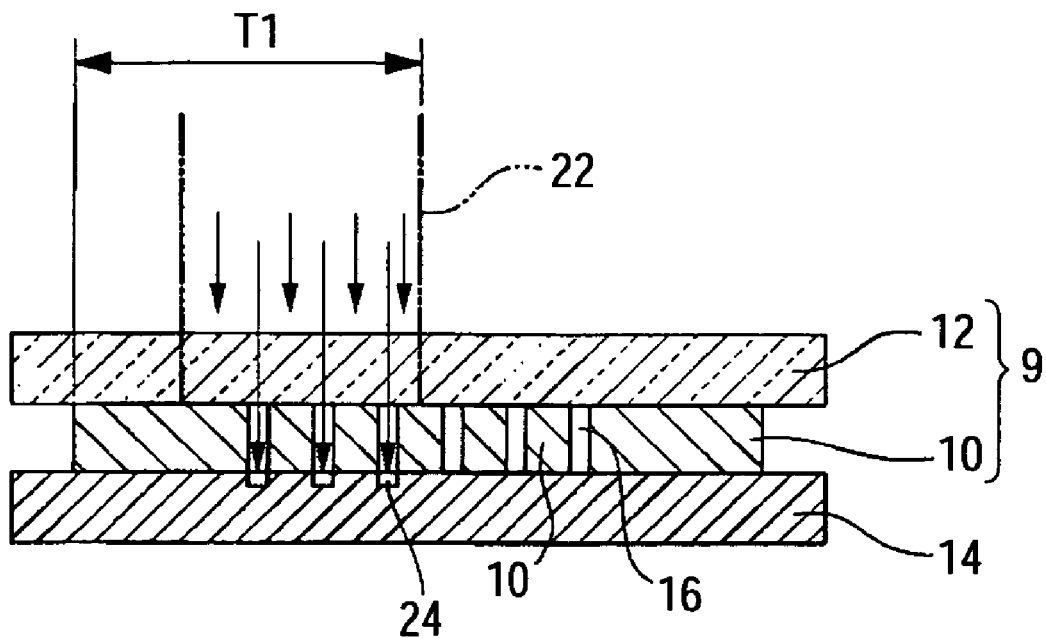
FIG. 9 is a cross-sectional view showing processes for forming pattern forming regions according to a fifth embodiment.

First, as shown in FIG. 9A, a laser device (not shown) for irradiating a laser beam 22 is moved to an irradiation region T1. Then, the laser device irradiates the laser beam 22 on the wiring substrate 14 in the irradiation region T1 from the upper side of the contact mask 9. Accordingly, as shown in FIG. 9A, the pattern forming regions 24 are formed by groove patterns on the wiring substrate 14 in the irradiation region T1.

Figure 9B:
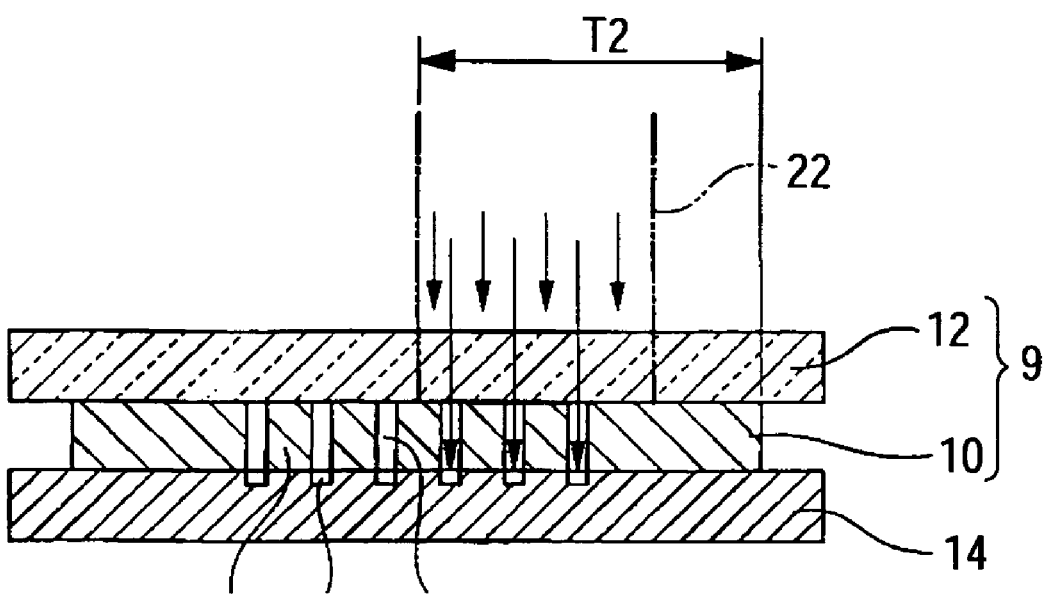

After that, as shown in FIG. 9B, a laser device (not shown) for irradiating a laser beam 22 is moved to an irradiation region T2. Then, the laser device irradiates the laser beam 22 on the wiring substrate 14 in the irradiation region T1. Accordingly, as shown in FIG. 9B, the pattern forming regions 24 are formed by groove patterns on the wiring substrate 14 in the irradiation region T2.

The entire surface of the wiring substrate 14 is used as an irradiation object in the laser beam irradiation method in which the entire surface is collectively irradiated by the laser beam 22. Therefore, the energy density of the laser beam 22 may become low. Meanwhile, since the scan type laser beam irradiation method is used in the present embodiment, the wiring substrate 14 is divided into several sections so as to reduce the area of the irradiation object. Therefore, it is possible to irradiate the laser beam having high energy density. For this reason, the energy density of the laser beam 22 can be changed depending on the substrate formed of various material so as to form the pattern forming regions. Even when it is impossible to collectively irradiate the laser beam 22 due to the fact that the wiring substrate 14 has a large area, the irradiation region is divided into several sections and then the laser beam 22 is irradiated on the several sections. Therefore, it is possible to reliably form the pattern forming regions 24 on the wiring substrate 14 having a large area.

Electro-Optical Device

Next, a liquid crystal display (electro-optical device) will be described. The liquid crystal display includes a flexible printed circuit (hereinafter referred to as a 'FPC') on which wiring patterns are formed by the above-mentioned wiring pattern forming method.

Figure 10:
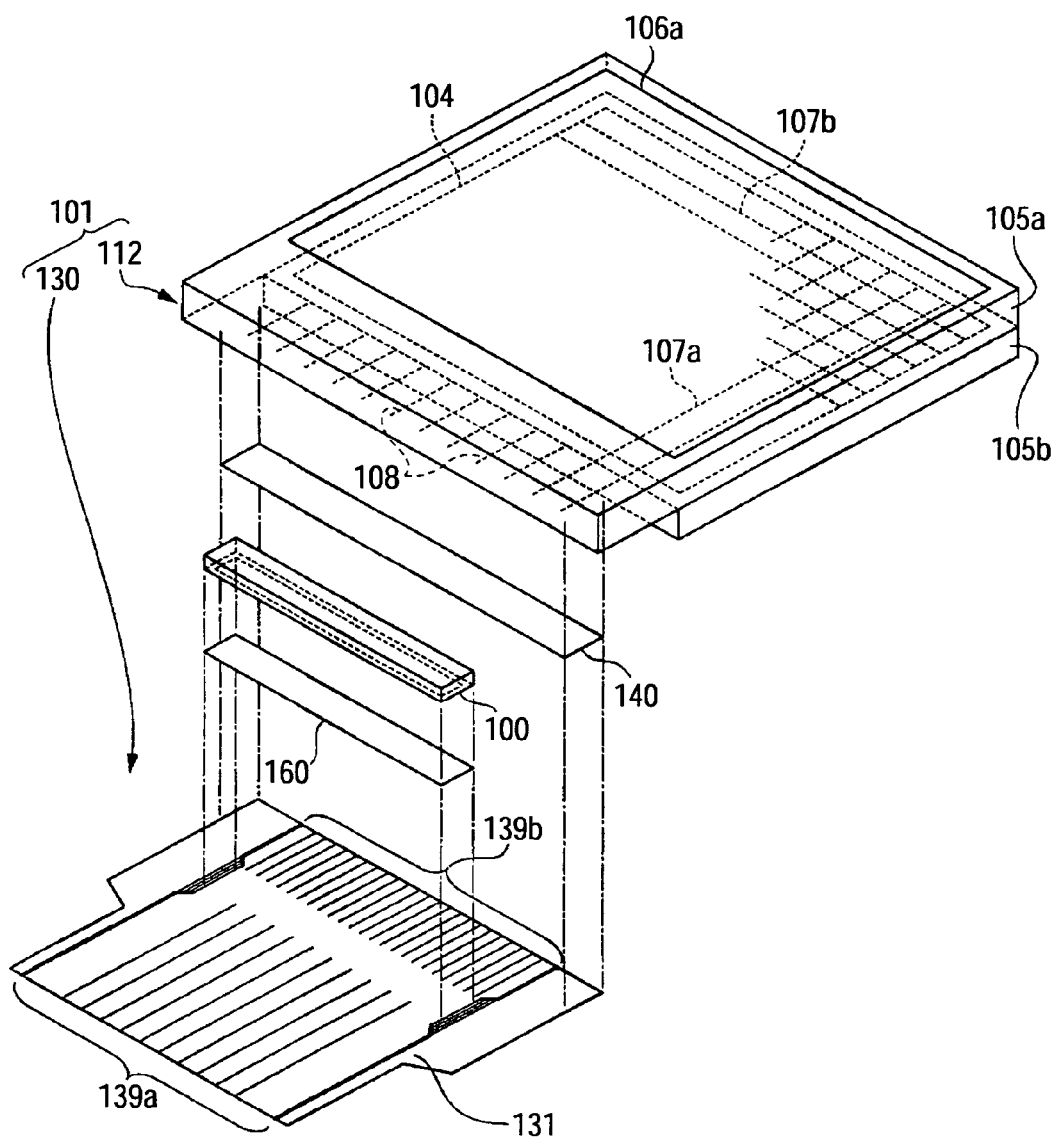
FIG. 10 is an exploded perspective view schematically showing a liquid crystal display.

FIG. 10 is an exploded perspective view showing a liquid crystal display that has COF (Chip On Film) structure. The liquid crystal display 101 includes a liquid crystal panel 112 for displaying colors, a FPC 130 connected to the liquid crystal panel 112, and a liquid crystal driving IC 100 mounted on the FPC 130. In addition, if necessary, an illuminating device such as a backlight, or other supplementary devices may be added to the liquid crystal panel 112.

The liquid crystal panel 112 has a pair of substrates 105a and 105b that are attached by the sealant 104, and a liquid crystal is filled in a gap formed between the substrates 105a and 105b, so called a cell gap. That is, the liquid crystal is interposed between the substrates 105a and 105b. In general, these substrates 105a and 105b are formed of a transparent material, for example, glass, synthetic resin, etc. A polarizing plate 106a is attached to the outer surface of the substrates 105a and 105b.

Furthermore, electrodes 107a (pixel electrodes) are formed on the inner surface of the substrate 105a, and electrodes 107b (common electrodes) are formed on the inner surface of the substrate 105b. These electrodes 107a and 107b are formed of, for example, a transparent material such as ITO (Indium Tin Oxide). The substrate 105a has an overhang portion, which protrudes ahead of the substrate 105b, and a plurality of terminals 108 are formed on the overhang section. When the electrodes 107a are formed on the substrate 105a, the terminals 108 are simultaneously formed with the electrodes 107a. Therefore, the terminals 108 are formed of, for example, ITO. The terminals 108 may extend from the electrodes 107a so as to be integrally formed with the electrodes 107a, and may be connected to the electrodes 107b by conductive materials (not shown).

Meanwhile, wiring patterns 139a and 139b are formed on the surface of the FPC 130 by means of the wiring pattern forming method according to the present embodiment. That is, the input wiring patterns 139a are formed from one narrow side of the FPC 130 toward the central portion thereof, and the output wiring patterns 139b are formed from the other narrow side thereof opposite to the one narrow side toward the central portion thereof. Electrode pads (not shown) are formed at the ends of the input wiring patterns 139a and the output wiring patterns 139b on the central portion of the FPC.

The liquid crystal driving IC 100 is mounted on the surface of the FPC 130. Specifically, a plurality of bump electrodes ACF, which is formed on the active surface of the liquid crystal driving IC 100, is connected to a plurality of electrode pads, which is formed on the FPC 130, through an ACF (Anisotropic Conductive Film) 160. The ACF 160 is formed by dispersing a plurality of conductive particles in the thermoplastic or thermosetting adhesive resin. Accordingly, the COF structure is obtained by mounting the liquid crystal driving IC 100 on the surface of the FPC 130.

Moreover, the FPT 130 having the liquid crystal driving IC 100 is connected to the substrate 105a of the liquid crystal panel 112 specifically, the output wiring patterns 139b of the FPC 130 are electrically connected to the terminals 108 of the substrate 105a through an ACF 140. In addition, since the FPC 130 is flexible, it is possible to reduce a space by folding the FPC 130 freely.

In the liquid crystal display 101 having the above-mentioned structure, a signal is input to the liquid crystal driving IC 100 through the input wiring patterns 139a of the FPC 130. Then, a driving signal is output to the liquid crystal panel 112 from the liquid crystal driving IC 100 through the output wiring patterns 139b of the FPC 130. Accordingly, images are displayed on the liquid crystal panel 112.

Electronic Apparatus

Hereinafter, a mobile phone, which is an example of an electronic apparatus according to the invention having the liquid crystal display 101, will be described.

Figure 11:
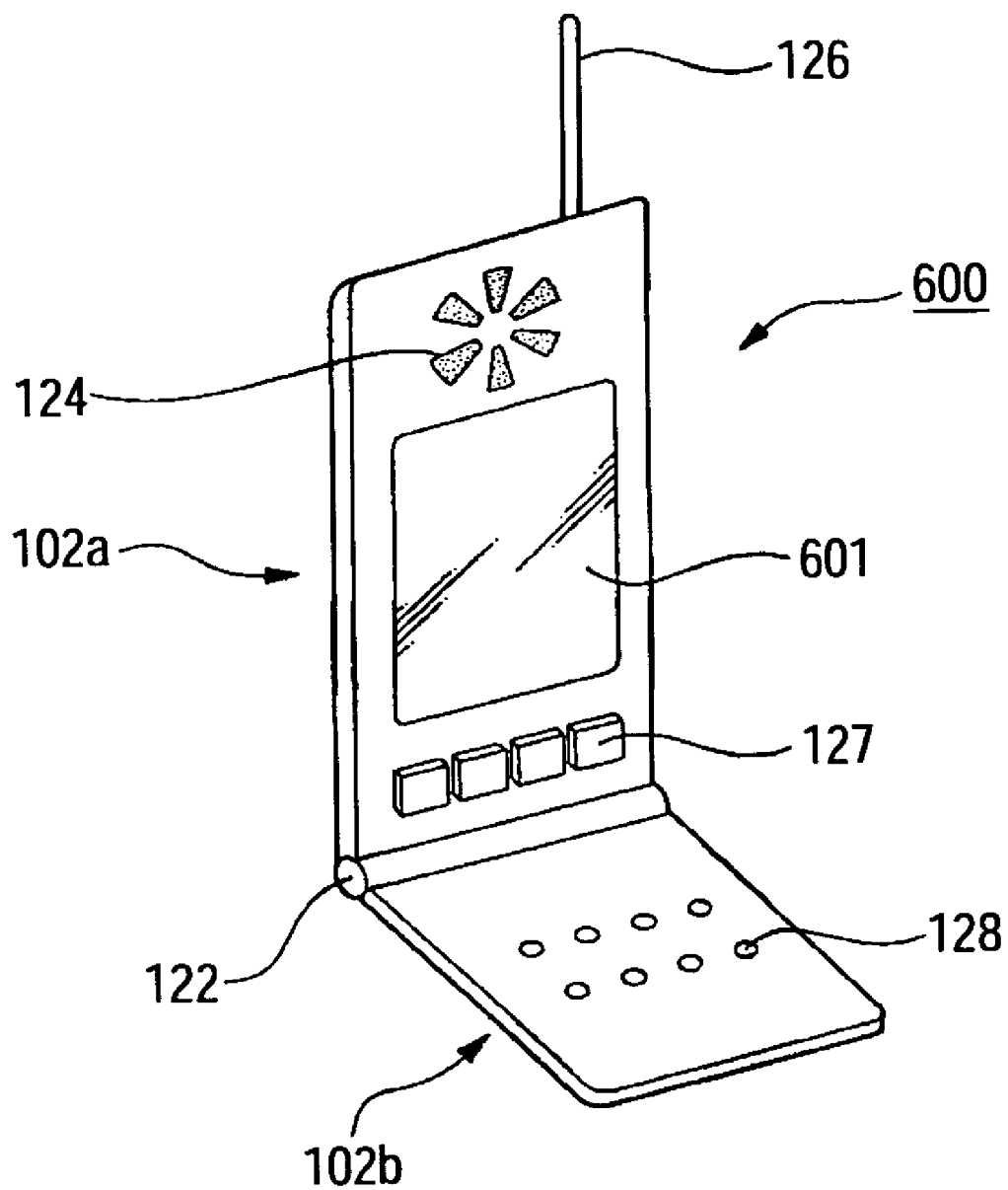
FIG. 11 is a perspective view schematically showing a mobile phone.

FIG. 11 is a perspective view showing an example of the mobile phone. FIG. 11 shows a mobile phone, which is an example of an electronic device according to the invention. The mobile phone 600 shown in FIG. 11 includes a first body 102a capable of being folded about a hinge 122, and a second body 102b. The fist body 102a is provided with a liquid crystal display 601, a plurality of operational buttons 127, an earpiece 124, and an antenna 126. The second body 102b is provided with a mouthpiece 128. In addition, although the electronic device according to the present embodiment includes the liquid crystal display, the electronic device may include another electro-optical device such as an organic electroluminescent display, plasma type display, etc. The another electro-optical device has a wiring substrate on which wiring patterns are formed by means of the above-mentioned wiring pattern forming method.

According to an electro-optical device of the present embodiment, such as a liquid crystal display, and an electronic device, such as a mobile, it is possible to provide an electro-optical device and an electronic device with high resolution and at low cost.

Furthermore, the wiring substrate, on which wiring patterns are formed by the pattern forming method and the wiring pattern forming of the present embodiment, can be applied to various electronic devices as well as the mobile phone. That is, it is possible to apply the wiring substrate to an electronic apparatus, for example, a liquid crystal projector, a multimedia-compliant personal computer (PC), an engineering workstation (EWS), a pager, a word processor, a television, a view finder type or monitor direct view type video cassette recorder, an electronic organizer, an electronic calculator, a car navigation device, a POS terminal, a device having a touch panel, etc.

Moreover, the invention is not limited to the above-mentioned embodiments, and various modifications may be made without departing from the spirit and scope of the invention. In addition, the above-mentioned embodiments may be combined without departing from the spirit and scope of the invention.

For example, a method, which is used for forming openings in the predetermined pattern on the pattern forming member 10, is not limited to the above-mentioned methods. For example, the openings can be formed by means of dry etching treatment. Furthermore, the thickness of the pattern forming member 10 formed of silicon can be reduced by performing an etching treatment from the rear surface thereof.

Moreover, a silicon wafer 10 having a plane orientation of (100) (single-crystal silicon substrate) is used as the pattern forming member 10 formed of silicon in the above-mentioned embodiments. However, when an infrared laser such as a $CO_2$ laser is used as the laser beam 22, the pattern forming member 10 can be formed of glass. In addition, although the pattern holding member 12 is formed of glass, when an infrared laser such as a $CO_2$ laser is used as the laser beam 22, the pattern holding member 12 can be formed of silicon. Furthermore, glass and silicon can be used as the above-mentioned various materials.

In addition, although one pattern forming member 10 is bonded to the pattern holding member 12 in the above-mentioned embodiments, the invention is not limited thereto. That is, it is possible to attach plurality of pattern forming member 10 to the pattern holding member 12 in order to form the contact mask 9. As a result, large-area patterns can be formed, and thus it is possible to reduce the manufacturing cost.

In the above-mentioned embodiments, the pattern forming member 10 and the pattern holding member 12 are bonded to each other by use of an anodic bonding method. However, it is possible to bone the pattern forming member 10 to the pattern holding member 12 with an adhesive. Various curing adhesive that includes a reaction curing adhesive, a thermal curing adhesive, a light curing adhesive such as an ultraviolet ray curing adhesive, an anaerobic curing adhesive are used as the adhesive. The adhesive may be any kinds of adhesive including, for example, epoxy system, acrylate system, silicon system, etc as composition.

Furthermore, in the process of forming the contact mask 9 of the above-mentioned embodiments, first, the through holes 16 are formed in the predetermined pattern through a silicon wafer 10 to form the pattern forming member 10. Then, the pattern forming member 10 is bonded or laminated on the pattern holding member 12. However, after the silicon wafer 10 is bonded or laminated on the pattern holding member 12, the through holes 16 may be formed in the predetermined pattern therethrough. According to this, when it is difficult to form the through holes 16 in the predetermined pattern through a silicon wafer 10, the pattern holding member 12 serves as a supporter for supporting the silicon wafer 10. Therefore, it is possible to easily form the through holes 16 in the predetermined pattern through the silicon wafer 10.

What is claimed is:

1. A mask which is used to form predetermined patterns on a substrate, comprising:
    a pattern forming member that includes a first surface, that is provided with openings corresponding to the predetermined patterns, and that includes alignment marks formed in an area that does not overlap the openings; and
    a pattern holding member that is coated on all remaining portions of the first surface of the pattern forming member and that holds the pattern forming member in place with respect to the substrate,
    wherein the pattern holding member does not have cavities in locations abutting the openings of the pattern forming member, and
    wherein the alignment marks of the pattern forming member are formed as through-holes.

2. The mask according to claim 1,
    wherein the pattern forming member blocks or extinguishes a laser beam, and the pattern holding member transmits the laser beam.

3. The mask according to claim 2,
    wherein the pattern holding member is at a position corresponding to the openings of the pattern forming member.

4. The mask according to claim 1,
    wherein each of the openings of the pattern forming member is bored through the pattern forming member so as to have a tapered shape tapering in the direction from the first surface of the pattern forming member toward a second surface thereof.

5. The mask according to claim 1,
wherein the pattern forming member is formed of a material including silicon or glass.

6. The mask according to claim 1,
wherein the pattern holding member is formed of a material that includes any one of soda glass, low alkali glass, quartz glass, crystal, and silicon.

7. The mask according to claim 1,
wherein the pattern holding member is formed of a material comprising glass including alkali metal ions.

8. A pattern forming method that forms patterns on a substrate in a predetermined pattern by using the mask according to claim 1, comprising:
disposing the mask on the substrate; and
forming pattern regions corresponding to the openings, which are formed on the pattern forming member in a predetermined pattern, by irradiating a laser beam on the substrate through the mask.

9. The pattern forming method according to claim 8,
wherein any one of an excimer laser, a gas laser and a solid laser is used as the laser beam in forming the pattern region.

10. The pattern forming method according to claim 8,
wherein the laser beam is irradiated on the substrate several times in forming the pattern region.

11. The pattern forming method according to claim 8, further comprising:
cleaning the mask with clearing solvent including sulphuric acid and aqueous hydrogen peroxide after the mask is separated from the substrate, after forming the pattern region,
wherein the substrate is formed of a material including an organic material.

12. A wiring pattern forming method that forms wiring patterns by disposing functional liquid on the pattern forming regions, which are formed on the substrate by use of the pattern forming method according to claim 8, by use of a liquid droplet discharging method.

13. The mask according to claim 4,
wherein the first surface and the second surface of the pattern forming member are parallel to each other, and
wherein each of the openings of the pattern forming member extend from the first surface to the second surface of the pattern forming member.

14. The mask according to claim 1,
wherein the all remaining portions of the first surface of the pattern forming member are bonded to the pattern forming member using anodic bonding.

* * * * *